United States Patent
Terao et al.

(10) Patent No.: US 6,471,768 B2
(45) Date of Patent: Oct. 29, 2002

(54) METHOD OF AND APPARATUS FOR GROWING RIBBON OF CRYSTAL

(75) Inventors: Kenji Terao, Fujisawa (JP); Hideyuki Isozaki, Yokohama (JP); Taro Takahashi, Yokohama (JP); Motohiro Niijima, Fujisawa (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/946,518

(22) Filed: Sep. 6, 2001

(65) Prior Publication Data
US 2002/0029735 A1 Mar. 14, 2002

(30) Foreign Application Priority Data
Sep. 11, 2000 (JP) ........................................ 2000-275315

(51) Int. Cl.$^7$ .............................................. C30B 15/20
(52) U.S. Cl. .............................. 117/16; 117/26; 117/27; 117/47; 117/211; 117/212
(58) Field of Search .............................. 117/16, 26, 27, 117/47, 87, 211, 212, 922

(56) References Cited

U.S. PATENT DOCUMENTS
4,239,583 A * 12/1980 Hatch et al. ................... 117/16
6,093,244 A * 7/2000 Easoz et al. ................... 117/15

FOREIGN PATENT DOCUMENTS
| JP | 10-279383 | 10/1998 |
| JP | 2000-239093 | 9/2000 |
| JP | 2000-319088 | 11/2000 |

* cited by examiner

*Primary Examiner*—Felisa Hiteshew
(74) *Attorney, Agent, or Firm*—Wenderoth, Lind & Ponack, L.L.P.

(57) ABSTRACT

A seed crystal is lowered toward a melt, and a contact between the seed crystal and the melt is detected using an image captured by an imaging device. The temperature of the melt is adjusted to keep a meniscus of the melt in contact with the seed crystal. The temperature of the melt is then lowered to create a wingout extending from the seed crystal. The length and symmetry of the wingout is detected with an image captured by the imaging device, and a ribbon of crystal following the wingout starts to be lifted from the melt.

13 Claims, 3 Drawing Sheets

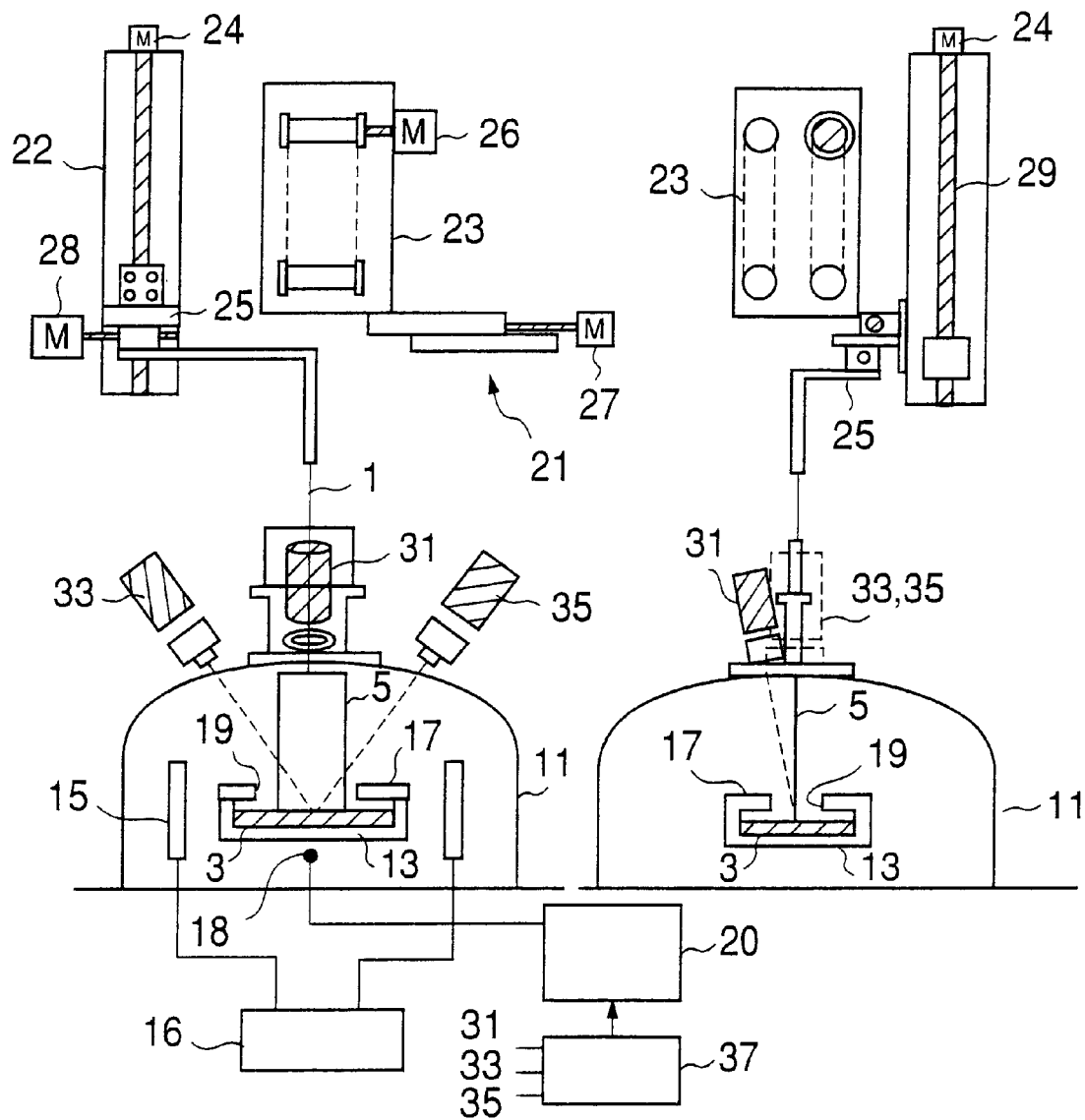

METHOD OF AND APPARATUS FOR GROWING RIBBON OF CRYSTAL

BACKGROUND OF THE INVENTION

1. Field of the Invention

The present invention relates to a method of and an apparatus for growing a ribbon of crystalline silicon for use in solar cells or the like.

2. Description of the Related Art

Heretofore, it has been customary to lift a ribbon of single crystalline silicon in a crystal growth furnace with manual actions performed by the operator while the operator is visually observing the interior of the crystal growth furnace. Specifically, the operator first dips a seed crystal in a melt of silicon at a high temperature by moving the actuator of a crystal lifter in an opposite direction and adjusting the speed of the actuator and stopping the actuator while observing an enlarged image of the melt that is captured by a television camera and displayed on a display monitor. Here, melt is also called as "free melt", which is a state in which high temperature liquid phases of semiconductor material is freely movable in the crucible.

The operator manually stops a descent of the seed crystal by changing the speed of the actuator to a low speed when the seed crystal approaches the melt and then pressing the stop button when the operator judges that the seed crystal touches the melt. Since the movement of the seed crystal is manually controlled, the length of the tip end of the seed crystal which enters the melt has not been constant. The temperature of the melt is controlled by measuring the time in which the tip end of the seed crystal becomes melted off. However, because the time in which the tip end of the seed crystal becomes melted off depends on not only the temperature of the surface of the melt but also the distance that the tip end of the seed crystal enters the melt, the temperature of the melt cannot accurately be controlled. For this reason, the temperature of the melt when the crystal is lifted off the melt tends to become unstable, and the growth of quality crystals depends on the skill of the operator.

The operator brings the seed crystal into contact with the melt at a temperature which allows the seed crystal to be kept in contact with the melt for a certain period of time. Then, the operator presses a button to lower the temperature, cooling the melt to a temperature capable of growing a silicon crystal. The silicon crystal grows laterally into a wingout. For producing a ribbon of single crystalline silicon, the seed crystal is held in contact with the melt in a particular crystal orientation, and a silicon crystal starts to grow linearly from the area where the seed crystal contacts the melt in a direction perpendicular to the direction in which the seed crystal is to be pulled up, due to growth anisotropy of the crystal. When the wingout has grown to an appropriate length, it starts to be lifted from the melt, thus forming a ribbon of single crystalline silicon.

The surface of the melt has conventionally been given a bathtub-shaped temperature distribution in the direction of wingout growth. Unless the length of the wingout is controlled at the time of starting to pull up the wingout, the temperature of the melt may be too low or high, making it difficult to achieve good crystal growth. If the tip end of the seed crystal is not at the symmetrical center of the wingout when the wingout starts to be lifted, then the growing crystal is brought out of balance and rotates off the surface of the melt, terminating the crystal growth. In order to prevent the above difficulties from occurring, it is necessary for the operator to observe the length and asymmetry of the wingout with an accuracy of 1 mm through a viewing window on the crystal growth furnace, and press a button to start lifting the wingout at a suitable time. However, the operator needs to be highly skilled to judge the time to press the button because the viewing window is generally spaced from the surface of the melt by several hundreds mm.

For stably growing a long ribbon of silicon, it is desirable to grow the crystal at the center of a growth slot which is positioned in an upper central region of the crystal growth furnace and through which the ribbon of silicon passes. Heretofore, crystals are often grown at an angle to the vertical direction owing to slight accuracy deviations of the crystal lifter. Therefore, it has been customary for the operator to control the position of the crystal lifter to bring the crystal at the center of the growth slot while visually observing the crystal through the viewing window. During the crystal growth, consequently, the operator is required to operate the crystal lifter while observing the interior of the furnace at all times. Inasmuch as the accuracy with which to operate the crystal lifter depends on the skill of the operator, it is difficult to obtain quality crystals reliably at all times.

If the temperature of the melt, particularly the temperature of the surface of the melt, varies due to some disturbances occurring during the crystal growth, then the crystal which is growing is liable to suffer defects that tend to impair the crystal growth. When the crystal growth is impaired, it is necessary for the operator to take the crystal out of the furnace immediately and raise the temperature of the melt. When the operator finds the crystal growth impaired, however, it has been the conventional practice for the operator to press a button and remove the crystal from the furnace.

Inasmuch as it has heretofore been necessary for the operator to press a button according to a judgment based on a visual observation during the growth of a ribbon of crystal, the operator's skill and labor has been required to produce such a ribbon of crystal. In addition, the operator's visual observation tends to suffer an error in millimeters, resulting in a judgment error and a control action error. Furthermore, various operators have different skill levels, and the cost of production and productivity have been problematic with the conventional crystal growing process.

SUMMARY OF THE INVENTION

It is therefore an object of the present invention to provide a method of and an apparatus for growing a ribbon of single crystalline silicon at a low cost without depending on the skill of the operator.

According to the present invention, there is provided a method of growing a ribbon of crystal, comprising the steps of lowering a seed crystal toward a melt, detecting a contact between the seed crystal and the melt with an image captured by an imaging device, adjusting the temperature of the melt to keep a meniscus of the melt in contact with the seed crystal, lowering the temperature of the melt to create a wingout extending from the seed crystal, detecting the wingout with an image captured by the imaging device, and starting to lift a ribbon of crystal from the melt following the detection of the wingout.

Solid/liquid phase interfaces of the melt in contact with the seed crystal and the wingout are detected with an image captured by the imaging device, and various actions can be performed while observing the captured image. Therefore, time instances for making those actions, which have heretofore depended on the skill of the operator, can reliably be determined based on the image information. Thus, even the operator who is not sufficiently skilled or even an apparatus which is not attended and operates almost fully automatically, allows a ribbon of crystal to grow accurately. As a result, a quality ribbon of crystal can continuously be lifted from the melt at a low cost.

Preferably, the method may further comprise the steps of lowering the seed crystal by a predetermined distance, stopping the seed crystal for a given period of time measured by a timer, attempting to detect a contact between the seed crystal and the melt while the seed crystal is stopped, and repeating the lowering, stopping, and attempting steps until a contact between the seed crystal and the melt is detected. These additional steps ensure that the seed crystal will reliably be brought into contact with the melt. Particularly, when a time in which a meniscus of the melt contacted by the seed crystal is retained is detected, the temperature of the melt can be adjusted accurately to an optimum value, allowing the ribbon of crystal to be pulled up stably.

Preferably, the method may further comprise the step of detecting coordinates of the seed crystal in a region of contact between the seed crystal and the melt, and a length and symmetry of the wingout extending from the coordinates. This step makes it possible to easily and reliably recognize the time to start lifting the ribbon of crystal.

Furthermore, it is also preferable to detect the coordinates of the ribbon of crystal being lifted from the image captured by the imaging device, and adjust the relative position of a crystal lifter to lift the ribbon of crystal at a certain position. The operator is not required to attend the process to monitor the lifting of the ribbon of crystal, but the ribbon of crystal which is of stable quality can automatically be lifted.

According to the present invention, there is also provided an apparatus for growing a ribbon of crystal, comprising a container containing a melt of crystal, a crystal lifter for lifting a seed crystal away from the melt of crystal, an imaging device for capturing an image of a ribbon of crystal produced from the melt by the seed crystal, and a controller for controlling the shape of the ribbon of crystal, and the temperature of the melt based on the image captured by the imaging device.

Specifically, an apparatus for growing a ribbon of crystal according to the present invention has video cameras as an imaging device and an image processor which are combined with a crystal lifter, for producing desired measured data with a high accuracy in units of 0.1 mm, and optimizing a process of converting captured images into binary images and a process of recovering captured images from errors, thereby to detect the lifting of a ribbon of crystal highly accurately. Most of actions which have heretofore been performed by the skilled operator based on its experience can be automatized. The apparatus can be automatically controlled based on measured parameters obtained by image processing which are used as a reference for judgment, to grow a ribbon of crystal essentially in the absence of the operator's intervention. As a result, it is possible to grow ribbons of crystal having a stable quality at an increased yield and a reduced cost.

The above and other objects, features, and advantages of the present invention will become apparent from the following description when taken in conjunction with the accompanying drawings which illustrate a preferred embodiment of the present invention by way of example.

BRIEF DESCRIPTION OF THE DRAWINGS

FIG. 1A is a front elevational view of an apparatus for growing a ribbon of single crystalline silicon according to the present invention;

FIG. 1B is a side elevational view of the apparatus shown in FIG. 1A;

DETAILED DESCRIPTION OF THE PREFERRED EMBODIMENTS

Figure 2A:
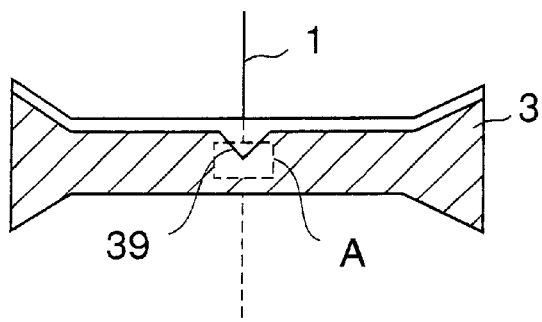
FIG. 2A is a cross-sectional view of a captured image showing a state of a melt after a meniscus is created.

FIGS. 1A and 1B show an apparatus for growing a ribbon of single crystalline silicon according to the present invention. The apparatus has a crucible 13 disposed in a housing 11 and containing a melt 3 of silicon at a high temperature. The crucible 13 is surrounded by heaters 15 which are supplied with current from a power supply 16. The current from the power supply 16 to the heaters 15 controls the temperature of the heaters 15 to control the temperature of the melt 3. A thermocouple 18 is positioned near the crucible 13 for detecting the temperature of the crucible 13. The thermocouple 18 applies a signal representing the detected temperature to a controller 20. The controller 20 outputs a control signal to the power supply 16 to control its current to adjust the temperature of the melt 3 in units of 0.1° C. The crucible 13 has an upper end closed by a lid 17 which has a growth slot 19 defined substantially centrally therein as an opening for lifting a ribbon of crystal therethrough.

The housing 11 has an opening defined centrally in an upper wall thereof for lifting a ribbon of crystal therethrough. A lifter 21 is disposed above the housing 11. The lifter 21 has a lifting/lowering device 22 for lowering or lifting a seed crystal 1, and a crystal ribbon lifting device 23 for continuously lifting a ribbon of crystal. The lifting/lowering device 22 has a motor 24 coupled to an upper end of a ball screw 29 over which there is threaded a holder 25 with the seed crystal 1 fixed thereto. When the motor 24 is energized, the ball screw 29 is rotated about its own axis to lift or lower the holder 25 for thereby lifting or lowering the seed crystal 1. The controller 20 controls the motor 24 to lift or lower the seed crystal 1 at a speed which may be 50 cm/min., 5 cm/min., 2 cm/min., or the like, selectively to positions that are spaced a pitch of 0.2 mm at minimum. When a ribbon of crystal joined to the seed crystal 1 is lifted to a highest position by the lifting/lowering device 22, the ribbon of crystal is transferred to a crystal ribbon lifter 23. The crystal ribbon lifter 23 has two belts for gripping the ribbon of crystal and continuously lifting the ribbon of crystal with a motor 26 that is connected to a roll engaged by one of the belts. The lifting/lowering device 22 and the crystal ribbon lifter 23 can be moved highly accurately to a desired horizontal position by respective stage motors 28, 27.

The housing 11 supports thereon three video cameras 31, 33, 35 for capturing images of the melt 3 in liquid and solid phases. The video camera 31 is disposed substantially directly above the crucible 13 for observing the growth of a ribbon of crystal in the melt 3 substantially from above, and the video cameras 33, 35 are disposed obliquely above the crucible 13 for observing the growth of a ribbon of crystal on its sides. The video cameras 31, 33, 35 are oriented to observe the ribbon of crystal through the growth slot 19. Output signals from the video cameras 31, 33, 35 are supplied via cables, not shown, to an image processor 37 which processes the signals for pattern matching, coordinate detection, etc. Processed data from the image processor 37 are outputted to the controller 20.

The lifting/lowering device 22 lowers the seed crystal 1 slowly into the melt 3 in a free state. The temperature of the melt 3 is adjusted to a temperature suitable for crystal growth, starting to grow a wingout in symmetrical directions from the seed crystal 1. The wingout is then pulled upwardly by the lifting/lowering device 22, growing a ribbon 5 of crystal, which has a width ranging from 5 cm to 7 cm and a thickness of about 100 $\mu$m, continuously from the melt 3. The crucible 13 is associated with the video cameras or imaging devices 31, 33, 35 for observing solid/liquid phase interfaces upon crystal growth on the melt 3, and the image processor 37 for processing image signals captured by the video cameras 31, 33, 35 as representing the region where the ribbon 5 of crystal is pulled from the melt 3. The processed image signals are used to detect the molten state of the silicon material, the vertical position of the seed crystal before it is dipped in the melt, the contact of the seed crystal with the melt, the length and symmetry of the wingout, the positions of the growth slot and the transverse opposite ends of the crystal, and any impairment of the crystal growth. Based on the detected states, the temperature of the melt and the operation of the lifting/lowering device 22 and the crystal ribbon lifter 23 are controlled.

Specifically, the apparatus according to the present invention has a function to repeat a succession of actions to electrically control the lifting/lowering device 22 to lower the seed crystal 1 by a given distance, stop the descent of the seed crystal 1 for a certain period of time measured by a timer, and attempt to detect a contact between the seed crystal 1 and the melt 3, until a contact between the seed crystal 1 and the melt 3 is actually detected. The apparatus also has a function to measure, with a template matching means, a change in the brightness of captured images of a region of the melt 3 which is expected to contact the seed crystal 1, for thereby detecting whether the seed crystal 1 has been brought into or out of contact with the melt 3. Furthermore, the apparatus has a function to detect a contact between the seed crystal 1 and the melt 3 and a state in which the seed crystal 1 is in contact with the melt 3 while lowering the temperature of the crucible 13 in units of the minimum resolution of the apparatus, for thereby adjusting the temperature of the melt 3 to an optimum level.

For starting to grow a ribbon of crystal, it is highly important to keep the temperature of the melt 3 at an optimum level. If the temperature of the melt 3 is higher than the melting point of silicon, then the silicon is in a liquid phase and no crystal growth occurs. In order to initiate a crystal growth from the melt 3, it is necessary that the melt 3 be in a supercooled state whose temperature is several ° C. lower than the melting point of silicon. However, it is difficult to measure, with an optical pyrometer, the temperature of the melt 3 in such a supercooled state because the direction of light radiated from the melt 3 is not uniform due to vibrations of the surface of the melt 3. The temperature of the melt 3 cannot be measured directly by a thermocouple because the temperature of the melt 3 is changed when the thermocouple is dipped therein. For these reasons, the temperature of the melt 3 at the time the seed crystal 1 is brought into contact with the melt 3 is measured by dipping the seed crystal 1 in the melt 3 and determining how the tip end of the seed crystal 1 is melted, e.g., counting seconds in which the tip end of the seed crystal 1 is melted off. By highly accurately determining the temperature of the melt 3 at the tip end of the seed crystal 1, it is made easy to determine a precise temperature for crystal growth. Specifically, the temperature for crystal growth can be a temperature that is a given temperature lower than a desired temperature of the melt 3 at the tip end of the seed crystal 1.

Heretofore, it has been customary for the operator to control the device for lowering the seed crystal to dip the seed crystal in the melt based on a visual observation of an image that is displayed on a display monitor based on a signal from a video camera. Depending on the depth to which the tip end of the seed crystal enters the melt, the time in which the tip end of the seed crystal is melted off varies even at the same melt temperature, and the temperature at which the tip end of the seed crystal is dipped in the melt is subject to a large error. The manually achieved depth to which the tip end of the seed crystal enters the melt cannot easily be repeated over and over again and tends to vary from operator to operator, thus presenting an obstacle to the determination of the temperature at which the tip end of the seed crystal is dipped in the melt for the control of a precise crystal growth. The apparatus according to the present invention solves the above problems as it is capable of accurately controlling the temperature of the melt at the time of starting to grow a crystal from the melt.

A method of growing a ribbon of single crystalline silicon with the above apparatus according to the present invention will be described below.

In the method, a contact between the seed crystal and the melt is detected based on a phenomenon that when the seed crystal contacts the melt, the melt is slightly raised around the tip end of the seed crystal due to the surface tension of the melt. The raised melt, also referred to as a meniscus, looks white as it reflects a radiation from surrounding parts that are glowing, whereas the other melt looks black. Such a brightness change can be detected as indicating a contact between the seed crystal and the melt according to a template pattern matching process. When the tip end of the seed crystal is dipped into the melt, since the surface of the melt is made concave due to the viscosity of the melt, no such brightness change occurs, failing to detect a contact between the seed crystal and the melt.

A contact between the seed crystal and the melt is detected while automatically controlling the rate of a descent of the seed crystal with an electric signal, as follows: When the seed crystal is lowered at a high speed at a position which is about 10 mm above the melt, the seed crystal enters the respective fields of view of the video cameras 33, 35. Part of the seed crystal that enters the respective fields of view of the video cameras 33, 35 is detected according to a template pattern matching process. Then, while the seed crystal is being intermittently lowered by small distances, an image processing process is carried out to detect a contact between the seed crystal and the melt. When the tip end of the seed crystal reaches a position that is several mm from the surface of the melt, the seed crystal is lowered 0.2 mm and stopped, and a process is carried out to detect whether or not the captured image represents a contact between the seed crystal and the melt. Since such a process takes about 2 seconds to perform according to the present image processing technology, the seed crystal is lowered 0.2 mm and stopped for 2 seconds while the image processing process is being carried out. If no contact between the seed crystal and the melt is detected, then the above cycle is repeated. By thus intermittently lowering the seed crystal by small distances, it becomes possible to limit the maximum distance that the seed crystal is dipped into the melt when a contact between the seed crystal and the melt is detected, and it also becomes possible to detect, by way of image processing, a state where the dipped tip end of the seed crystal is melted and contacts the melt. When the seed crystal is thus intermittently lowered at sufficient time intervals for image processing, it is possible to prevent the dipping of the seed crystal in the melt from being erroneously detected as a non-contact between the seed crystal and the melt, and also to prevent the apparatus from making an erroneous action to promote the dipping of the seed crystal in the melt. When a contact between the seed crystal and the melt is detected by the above image processing process, the lowering of the seed crystal is immediately stopped.

Then, the temperature of the melt is detected and adjusted. As described above, the temperature of the melt, which cannot directly be detected, is highly important in governing the quality of the crystal growth. The temperature of the melt is detected and confirmed based on the time for which the melt is slightly raised around the tip end of the seed crystal, i.e., the meniscus is retained. Specifically, if the temperature of the melt is too high, the meniscus disappears quickly at the same time that the seed crystal is brought into contact with the melt. When the tip end of the seed crystal is brought into contact with the melt and the meniscus is created, the time for which the meniscus is retained is measured. Then, the temperature achieved by the heaters 15 is lowered to gradually lower the temperature of the melt to produce a temperature state where the meniscus is retained for about 15 seconds or more. The temperature state is represented by a highly critical temperature. For example, if the temperature of the melt is 0.1° C. higher, then the meniscus disappears in several seconds. If the temperature of the melt is 0.1° C. lower than the higher temperature, then the meniscus can be retained for about 15 seconds or more.

Figure 2B:
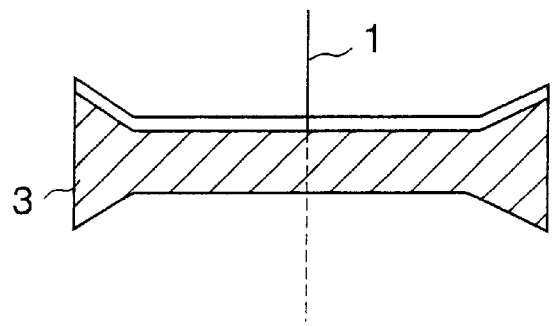
FIG. 2B is a cross-sectional view of a captured image showing a state of a melt before a meniscus is created.
Figure 2C:
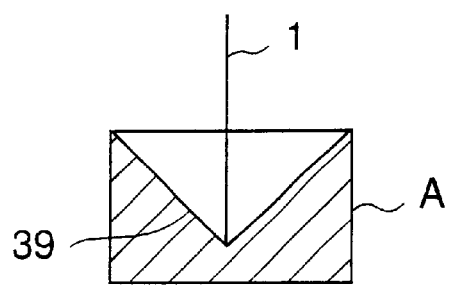
FIG. 2C is an enlarged cross-sectional view showing an enclosed area A in FIG. 2A.

FIG. 2A shows a captured image in which a meniscus 39 is detected. The meniscus 39 is indicated as a region of the melt 3 which is raised around the tip end of the seed crystal 1. FIG. 2B shows a captured image in which the seed crystal 1 is not held in contact with the melt, with no meniscus created. FIG. 2C shows a template pattern matching area A in the captured image shown in FIG. 2A. By performing a pattern matching between a white pixel region in the template pattern matching area A and a registered pattern, it is possible to automatically determine the formation of the meniscus 39 which has a predetermined size. Then, a timer is activated to measure a time in which the meniscus 39 is retained. When the time in which the meniscus 39, determined by the pattern matching process, is retained is thus measured, the temperature of the melt can be adjusted to an optimum temperature for the state in which the seed crystal 1 is held in contact with the melt. The temperature for crystal growth, described below, can be determined highly accurately based on the optimum temperature of the melt. Accordingly, the probability of success of starting to grow a crystal and the stability of the crystal growth can greatly be increased.

While the time in which the seed crystal is continuously held in contact with the melt is being measured, if a signal indicative of the contact between the seed crystal and the melt is temporarily interrupted due to noise or the like, then the tip end of the seed crystal may possibly be erroneously recognized as being dissolved. For preventing the tip end of the seed crystal from being erroneously recognized as being dissolved, it is effective to stay in the control loop for 5 seconds after the interruption of the signal indicative of the contact between the seed crystal and the melt, and to keep measuring the time with the timer when the signal indicative of the contact between the seed crystal and the melt appears again.

After the contact between the seed crystal and the melt is detected and the temperature of the melt is measured, the melt is cooled to a temperature capable of growing a crystal. The temperature is a predetermined temperature lower than the temperature of the melt which is determined based on the time in which the meniscus is retained. Specifically, if the crystal growth is anisotropic, then a crystal of silicon is linearly grown on the surface of the melt from the seed crystal. The solidified crystal of silicon looks white because it has an emissivity higher than the melt. The solidified crystal of silicon which looks white is referred to as a wingout. When the length of the wingout reaches a suitable length, the grown crystal of silicon starts being lifted.

The surface of the melt is given a temperature distribution suitable for the crystal growth. Unless the length of the wingout is controlled at the time of starting to pull up the wingout, the temperature of the melt may be too low or high, lowering the probability of success of the starting of the crystal growth. When the wingout starts being lifted, the seed crystal is vertically lifted to grow the crystal. If the tip end of the seed crystal is not positioned at the symmetrical center of the wingout, then the growing crystal is brought out of balance and rotates off the surface of the melt, terminating the crystal growth. In order to prevent the above difficulties from occurring, it is necessary to observe the wingout which has a length of at least 40 mm for length and asymmetry with an accuracy of at least 1 mm (2.5%).

Figure 3A:
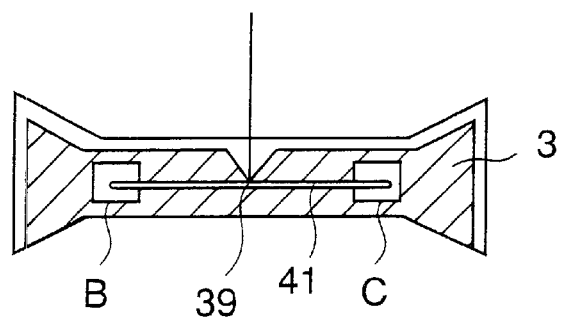
FIG. 3A is a cross-sectional view of a captured image showing a state of a melt where a wingout is formed.
Figure 3B:
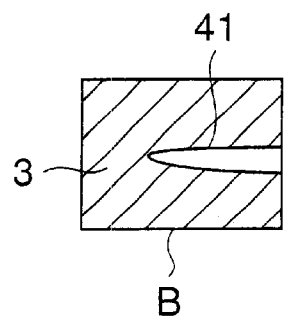
FIGS. 3B and 3C are enlarged cross-sectional views of tip ends of the wingout.
Figure 3C:
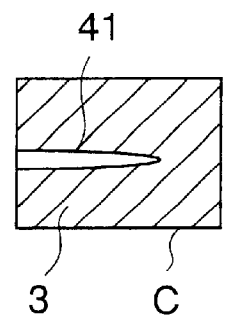

Heretofore, the wingout has been visually observed by the operator through a viewing window. The operator needs to be highly skilled to observe the wingout because the viewing window is spaced from the surface of the melt by several hundreds mm and the viewing window has a limited field of view. In the apparatus according to the present invention, the location where the seed crystal contacts the melt and the coordinates of the opposite ends of the wingout are detected from a captured image shown in FIG. 3A. In FIG. 3A, pattern matching areas B, C are located at the transverse opposite ends of a wingout image 41 which extends from the center of the meniscus 39 and which looks white. When the wingout 41 enters the pattern matching areas B, C, as shown in FIGS. 3B and 3C, the wingout 41 is detected according to a template matching process. The location where the seed crystal contacts the melt is determined by converting images of small regions obtained by the template matching process when the contact between the seed crystal and the melt is detected, into binary images using an average of integrated brightness values as a threshold, determining the shape of the meniscus from boundary coordinates of the binary images, and using the vertex of the shape as the coordinates of the location where the seed crystal contacts the melt. The positions of the tip ends of the wingout are determined in the accuracy of pixels by observing a wide area of the surface of the melt, obtaining small regions according to the template matching process, converting images of the small regions using an average of integrated brightness values as a threshold, determining the coordinates of tip ends of the wingout from the binary images, and determining maximum values of the coordinates in the direction of growth of the wingout. The length and asymmetry of the wingout can easily be calculated from the coordinates of the opposite ends of the wingout and the coordinates of the center of the location where the seed crystal contacts the melt.

The measured length and asymmetry of the wingout are then compared with an expected length and an allowable value for asymmetry of the wingout. Only when the measured length and asymmetry of the wingout satisfy certain conditions, the apparatus automatically starts to pull up the grown crystal from the melt. If the measured asymmetry of the wingout exceeds the allowable value for asymmetry, then the grown crystal is not lifted, and a crystal is grown again. In this case, the asymmetric data can be fed back to effect optimization control for the temperature distribution to increase the possibility of success for a next crystal growth process. If the measured asymmetry of the wingout exceeds the allowable value for asymmetry due to a deviation of the position where the seed crystal contacts the melt, then the position where the seed crystal contacts the melt may be automatically shifted to an optimum position to prevent the measured asymmetry of the wingout from exceeding the allowable value for asymmetry, and then a crystal may start being grown.

For growing a ribbon 5 of crystal, the positions of the transverse opposite ends of the ribbon 5 of crystal which has been lifted over a large distance and the position of the growth slot 19 are detected according to an image processing process, and the position where the ribbon 5 of crystal is lifted is automatically controlled by the motor 27 such that the ribbon 5 of crystal is grown centrally in the growth slot 19 at all times. The above automatic positional control and the system for automatically optimizing the temperature distribution make it possible to allow a crystal to grow highly stably automatically.

Figure 4:
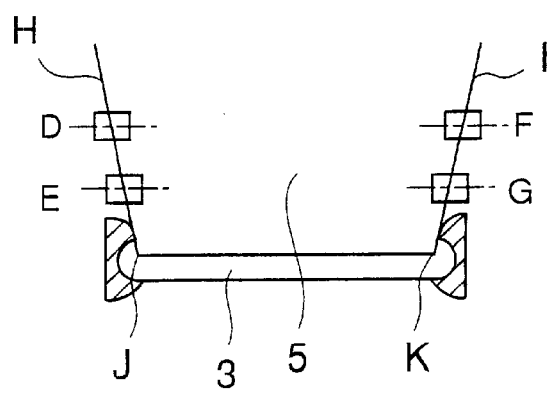
FIG. 4 is a view of a captured image showing a ribbon of crystal that is pulled from the melt.

FIG. 4 shows a captured image showing the ribbon 5 of crystal that is pulled from the melt 3. The coordinates of the positions of the transverse opposite ends of the ribbon 5 of crystal are detected from the image shown in FIG. 4. Since the solid/liquid phase interfaces are bright as a whole and have a blurred profile due to a rise of the surface of the melt which is caused by the surface tension developed by the lifting of the crystal, they are not suitable for the detection of the coordinates of the transverse opposite ends of the ribbon 5 of crystal which is being grown. Instead, the coordinates of the transverse opposite ends of the ribbon 5 of crystal are determined at two points above the solid/liquid phase interfaces and statistically processed to draw approximate lines H, I, and the coordinates J, K of the transverse opposite ends of the ribbon 5 of crystal near the solid/liquid phase interfaces are determined by extending the approximate lines H, I. The accuracy of the approximate lines H, I increases if the region which is measured is wide and the number of data is large. However, since the crystal which is being grown has a large brightness gradient in the vertical direction due to the temperature gradient, it is highly difficult to obtain a threshold for converting images of the ends of the crystal into binary images in a wide region with a sufficient resolution.

In the apparatus according to the present invention, small regions D, E, F, G near the ends of the crystal are established with respect to a plurality of vertical positions where the brightness can be regarded as constant, according to a template matching process, the brightness values of the images of the small regions D, E, F, G are differentiated to emphasize their edges, the brightness values are converted into binary levels with an average of integrated brightness values, and the coordinates of the transverse opposite ends of the ribbon of crystal are obtained from a distribution of coordinates of the binary levels. These coordinate data are approximated to straight lines by a statistically approximating means, obtaining the hypothetical straight lines H, I.

With respect to the growth slot, an area near a central straight region thereof is detected by a template matching process, and a small region in the vicinity thereof is converted into a binary image with an average of integrated brightness values, determining the coordinates of the shape. The coordinates are then statistically approximated to a hypothetical straight line, which is translated to a desired position in the growth slot. Points of intersection between the translated straight line and the approximate straight lines at the left and right ends of the crystal are determined and used as the coordinates of the ends of the crystal.

With respect to the growth slot, a small region in the vicinity of the left and right lower ends of the growth slot is established by template matching process, and converted into a binary image with an average of integrated brightness values. The coordinates of the left and right ends of the growth slot are determined from the binary image. A deformation of the crystal easily be calculated by comparing the left and right ends of the growth slot with the left and right ends of the crystal. In some cases, an average value over a certain period of time may be used, and the moving stage of the crystal lifter may be electrically actuated to correct a displacement difference for thereby keeping the crystal at the center of the growth slot in an unattended fashion. For more accurate positional correction, image information may also be read from the left and right video cameras, and three-dimensional image processing may be carried out, so that the crystal can be positionally corrected three-dimensionally with an electrically actuated xyθ stage.

In the event that the crystal growth is impaired for some reason, separating the crystal from the surface of the melt, which has been contacted by the crystal and raised during the normal crystal growth, and hence has looked white, becomes black in the absence of reflections upon separation of the crystal from the melt. By detecting such a change in the brightness of the surface of the melt, it is possible to automatically detect when the crystal growth is impaired and the crystal is separated from the melt. When the impairment of the crystal growth is detected, the apparatus is controlled in a sequence to immediately lower the temperature of the melt, quickly remove the crystal until the lower end thereof is brought out of the furnace, and issue some warning when the crystal is displaced completely out of the furnace. In this manner, the operation of the apparatus after the end of the crystal growth is automatized.

In the above embodiment, any of various image processing processes may be employed depending on the relationship between the processing speed and the detecting accuracy.

Although a certain preferred embodiment of the present invention has been shown and described in detail, it should be understood that various changes and modifications may be made therein without departing from the scope of the appended claims.

What is claimed is:

1. A method of growing a ribbon of crystal, comprising:
   lowering a seed crystal toward a melt;
   detecting a contact between said seed crystal and said melt with an image captured by an imaging device;
   adjusting the temperature of said melt to keep a meniscus of said melt in contact with said seed crystal;
   detecting a wingout with an image captured by said imaging device; and then
   starting to lift a ribbon of crystal from said melt.

2. The method according to claim 1, wherein detecting a contact between said seed crystal and said melt comprises:

lowering said seed crystal;

stopping said seed crystal for a given period of time measured by a timer;

attempting to detect a contact between said seed crystal and said melt while said seed crystal is stopped; and repeating said lowering, stopping, and attempting until a contact between said seed crystal and said melt is detected.

3. The method according to claim 1, wherein detecting a wingout comprises:

detecting coordinates of said seed crystal in a region of contact between said seed crystal and said melt, and a length and symmetry of said wingout extending from said coordinates.

4. A method of growing a crystal, comprising:

lowering a seed crystal toward a melt;

detecting a contact between said seed crystal and said melt via an image obtained by performing a template matching process;

adjusting the temperature of said melt; and starting to lift a crystal.

5. A apparatus for growing a ribbon of crystal, comprising:

a container for containing a melt in a crucible;

a lifter/lowering device for lowering a seed crystal into the melt and lifting the seed crystal away from the melt;

an imaging device for capturing images of the surface of the melt and a ribbon of crystal produced from the melt; and a controller for controlling conditions for growing the ribbon of crystal based on the images captured by said imaging device.

6. The apparatus according to claim 5, wherein said imaging device is to capture an image of solid/liquid phase interfaces of the melt.

7. The apparatus according to claim 5, wherein said imaging device is to capture an image of a meniscus formed by contact between the seed crystal and the melt.

8. The apparatus according to claim 7, wherein said controller is to adjust a temperature of the melt so as to keep the meniscus on the melt.

9. The apparatus according to claim 8, wherein said controller is to lower the temperature of the melt to create a wingout extending from the seed crystal.

10. The apparatus according to claim 9, wherein said controller is to start to lift a ribbon of crystal after detection of the wingout via an image captured by said imaging device.

11. The apparatus according to claim 5, wherein said imaging device includes at least a video camera to be disposed substantially directly above the crucible for observing a surface of the melt and a growth of a ribbon crystal through a growth slot.

12. The apparatus according to claim 5, further comprising a measuring device to measure the length and symmetry of a wingout.

13. The apparatus according to claim 5, further comprising a measuring device to measure the temperature of the melt by determining how long a meniscus is retained.

* * * * *